United States Patent
Yu et al.

(10) Patent No.: US 7,063,136 B2
(45) Date of Patent: Jun. 20, 2006

(54) HEAT DISSIPATION DEVICE HAVING CAP FOR PROTECTING THERMAL INTERFACE MATERIAL THEREON

(75) Inventors: Fang-Xiang Yu, Shenzhen (CN); Meng-Tzu Lee, Tu-Cheng (TW); Shu-Ho Lin, Tu-Cheng (TW)

(73) Assignee: HON HAI Precision Industry Co., LTD, Tu-cheng (TW)

( * ) Notice: Subject to any disclaimer, the term of this patent is extended or adjusted under 35 U.S.C. 154(b) by 95 days.

(21) Appl. No.: 11/135,571

(22) Filed: May 23, 2005

(65) Prior Publication Data
US 2006/0042787 A1 Mar. 2, 2006

(30) Foreign Application Priority Data
Aug. 25, 2004 (CN) .......................... 200420083410

(51) Int. Cl.
*H05K 7/20* (2006.01)
(52) U.S. Cl. ........................ 165/185; 361/705
(58) Field of Classification Search ............... 165/185; 361/704, 705
See application file for complete search history.

(56) References Cited

U.S. PATENT DOCUMENTS

| 5,897,917 | A | | 4/1999 | Hinshaw et al. |
| 6,029,740 | A | * | 2/2000 | Lee et al. ...................... 165/76 |
| 6,049,458 | A | * | 4/2000 | Lee et al. .................... 361/705 |
| 6,828,673 | B1 | * | 12/2004 | Ficorilli et al. ............. 257/707 |
| 2004/0252461 | A1 | * | 12/2004 | Wu ............................. 361/704 |

OTHER PUBLICATIONS

IBM TDB Issue #4 vol. 29 pps. 1469-1470 Sep. 1, 1986 "Thermal Grease Module Cap Design".*

* cited by examiner

*Primary Examiner*—Allen J. Flanigan
(74) *Attorney, Agent, or Firm*—Morris, Manning & Martin; Tim Tingkang Xia, Esq.

(57) ABSTRACT

A heat dissipation device includes a heat sink (10), thermal interface material (30) spread on a bottom surface (16) of the heat sink, two legs (22) of a clip (20) disposed at opposite sides of the heat sink, and a protective cap (40) enclosing the thermal interface material therein. The protective cap includes ears (48) interlocked with the legs of the clip to retain the protective cap to the heat sink. The legs of the clip are also used for interlocking with engaging member (52) on a printed circuit board (50) thereby firmly mounting the heat sink to a CPU (54) on the printed circuit board.

18 Claims, 6 Drawing Sheets

HEAT DISSIPATION DEVICE HAVING CAP FOR PROTECTING THERMAL INTERFACE MATERIAL THEREON

TECHNICAL FIELD

The present invention relates to a heat dissipation device, and more particularly to a heat dissipation device having a removable protective cap for enclosing thermal interface material on the heat dissipation device, thereby avoiding the thermal interface material to be contaminated or destroyed before the heat dissipation device is assembled to an electronic package.

BACKGROUND

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example, by using a heat sink attached to the CPU in the enclosure. This allows the CPU and other electronic components in the enclosure to function within their normal operating temperature ranges, thereby assuring the quality of data management, storage and transfer.

To improve heat conductivity between a heat sink and a CPU, thermal interface material such as thermal grease is often applied to a bottom face of the heat sink. However, thermal grease can not be applied to the heat sink in advance since it is not solid at ambient temperature and may contaminate surrounding articles or be contaminated by dust or foreign particles before the heat sink is attached to the CPU. Conventionally, the thermal grease is applied onto the heat sink just prior to attachment of the heat sink to the CPU. This operation extends the time needed for said attachment.

To overcome the above problem, various grease covers have been developed. The grease covers are attached to a bottom surface of a heat sink to enclose the thermal grease spread on the bottom of the heat sink. The thermal grease can not be contaminated by dust or foreign particles, and does not contaminate surrounding articles when the heat sink is transported or handled. By using the grease cover, the thermal grease can be applied to the heat sink in advance, thereby simplifying the process of attachment of the heat sink to the CPU. However, the grease cover is usually attached to the bottom of the heat sink by adhesive. The adhesive must be cleaned from the heat sink before the heat sink is attached to the CPU. This is unduly inconvenient.

What is needed, therefore, is a heat dissipation device having a protective cap for thermal interface material which can be readily attached to or detached from a heat sink of the heat dissipation device.

SUMMARY OF THE INVENTION

According to a preferred embodiment of the present invention, a heat dissipation device comprises a heat sink, on a bottom of which thermal interface material is spread, two locking legs disposed at opposite sides of the heat sink, and a protective cap enclosing the thermal interface material therein. The protective cap comprises locking portions interlocked with the locking legs to retain the protective cap to the heat sink.

Other advantages and novel features of the present invention will be drawn from the following detailed description of the preferred embodiment of the present invention with attached drawings, in which:

DETAILED DESCRIPTION OF PREFERRED EMBODIMENT

Figure 1:
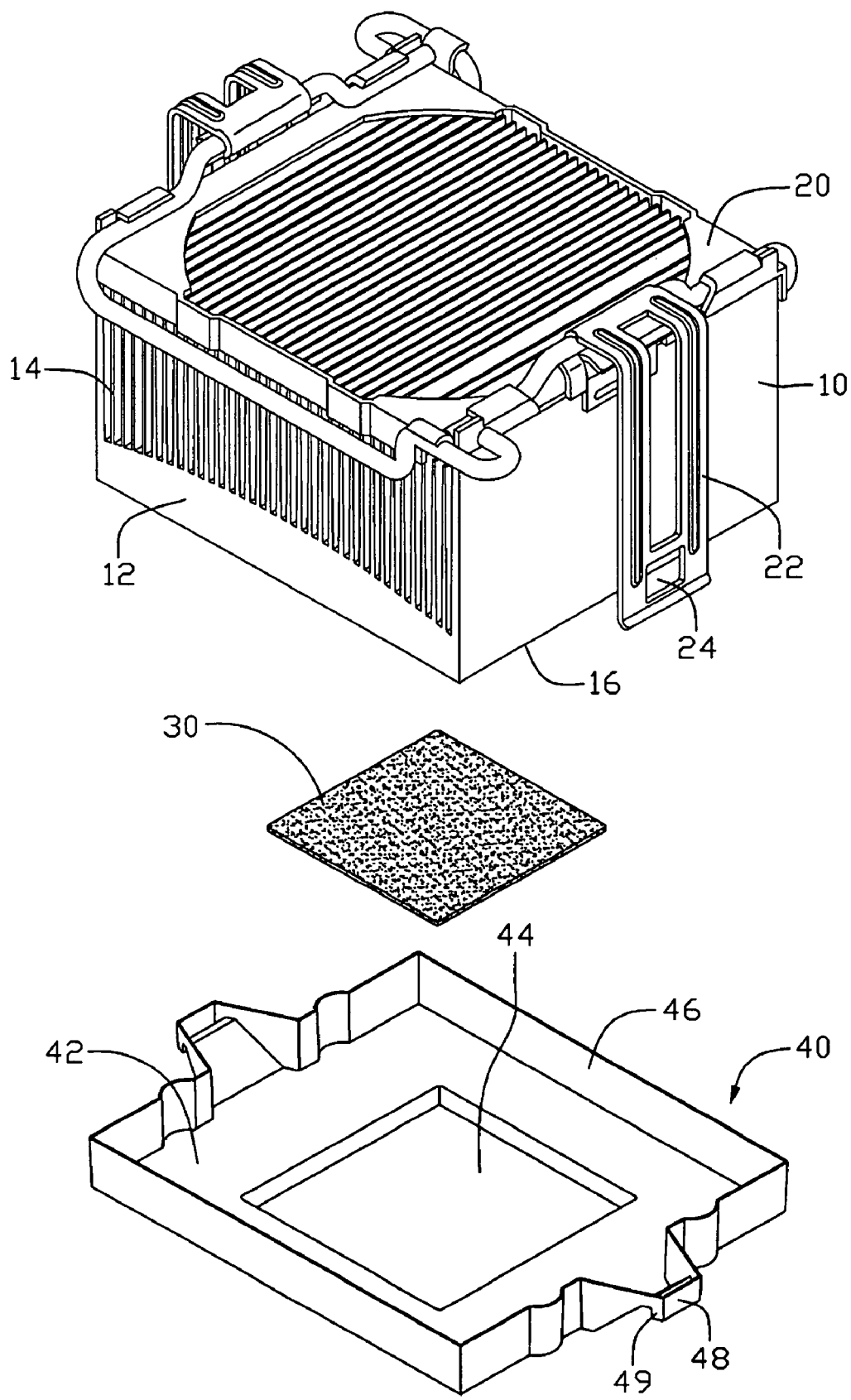
FIG. 1 is an exploded, isometric view of a heat dissipation device in accordance with a preferred embodiment of the present invention.
Figure 2:
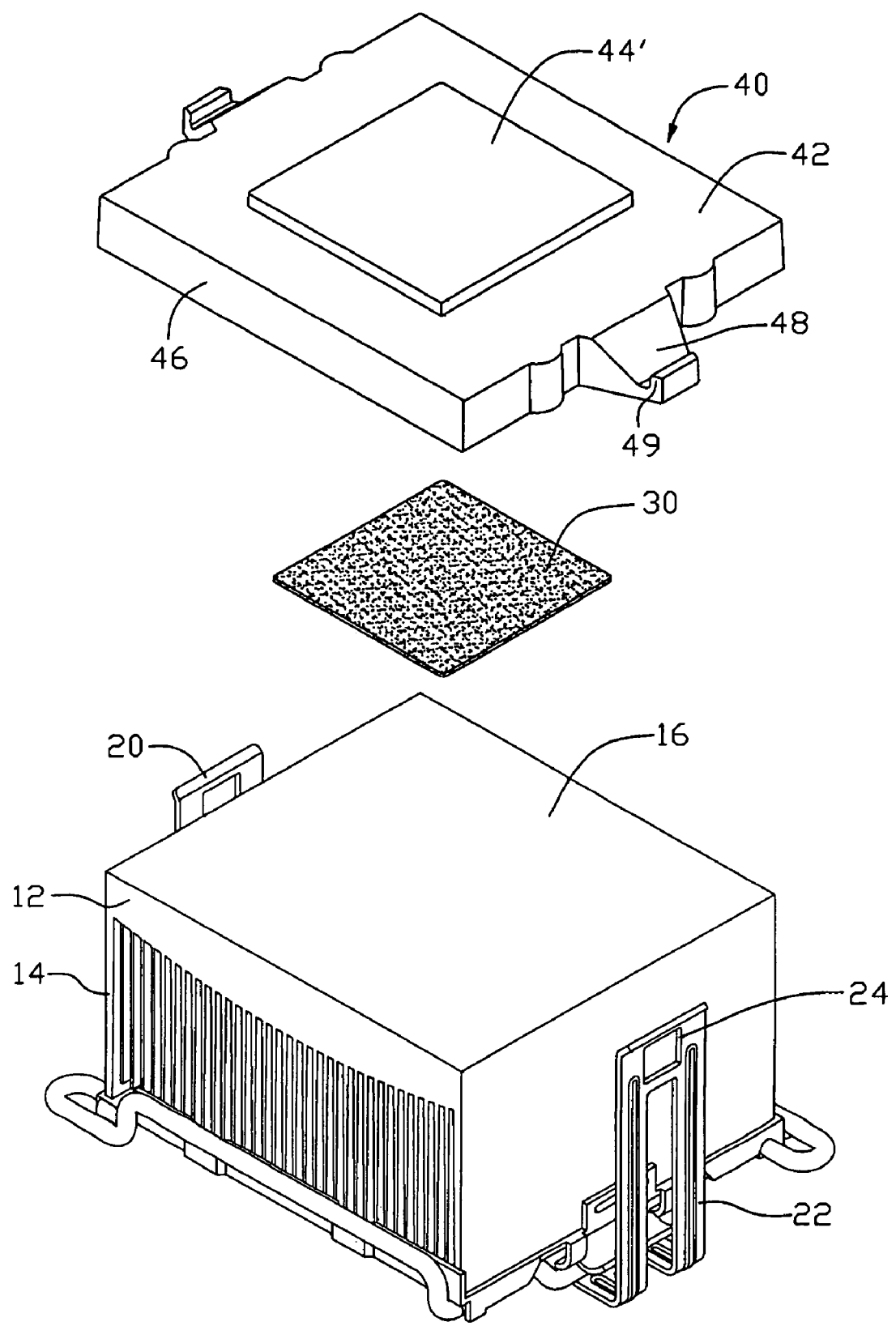
FIG. 2 is the heat dissipation device of FIG. 1 viewed from another aspect.
Figure 6:
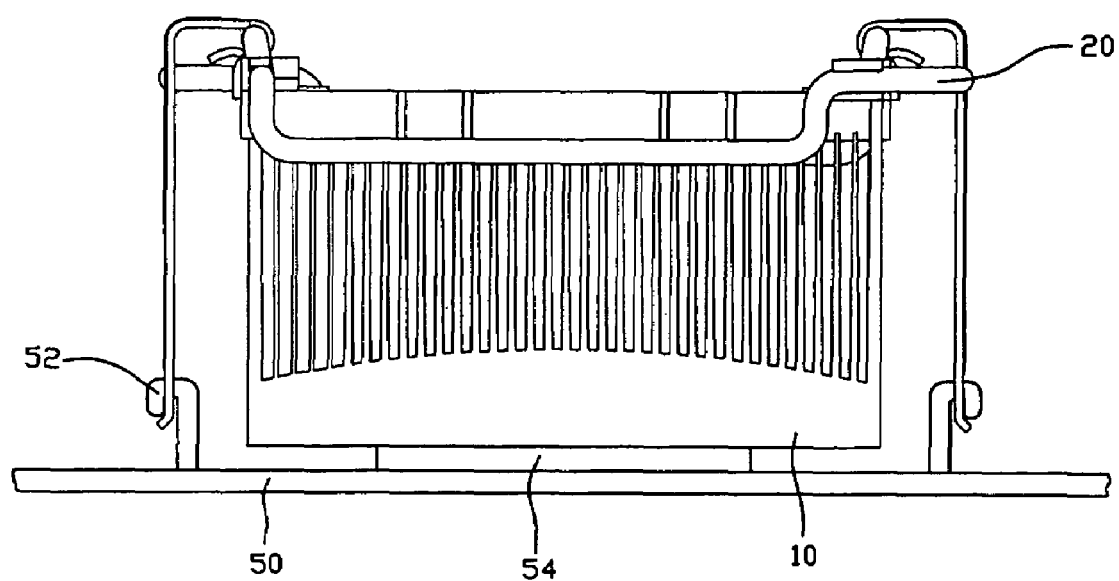
FIG. 6 is a side view of FIG. 5.

Referring to FIG. 1 and FIG. 2, a heat dissipation device in accordance with a preferred embodiment of the invention comprises a heat sink 10, a clip 20 mounted on the heat sink 10, thermal interface material 30 such as thermal grease or thermal tape spread on a bottom of the heat sink 10, and a protective cap 40 employed to the heat sink 10 for preventing the thermal interface material 30 from being contaminated or destroyed before the heat sink 10 is assembled onto an electronic package, such as a CPU 54 (FIG. 6).

The heat sink 10 comprises a base 12 and a plurality of fins 14. The base 12 has a bottom surface 16 for thermally contacting with the CPU 54. The fins 14 extend from the base 12 away opposing to the bottom surface 16.

The clip 20 is mounted on a top of the heat sink 10 for positioning the heat sink 10 on the CPU 54. Two legs 22 extend downwardly from the clip 20, disposed at opposite sides of the heat sink 10, and being pivotable with respect to the heat sink 10. Each leg 22 defines an aperture 24 in a free end portion thereof.

Thermal interface material 30 has a rectangular shape and is evenly spread on a middle portion of the bottom surface 16 by a printing process, preferably a screen printing process.

The protective cap 40 is for being removably attached to the bottom surface 16 of the heat sink 10 to enclose the thermal interface material 30. The protective cap 40 has a generally rectangular configuration and comprises a basewall 42 and sidewalls 46 extending upwardly from a periphery of the basewall 42. A protrusion 44' extends downwardly from a central portion of the basewall 42 and then defines a cavity 44 in the central portion of the basewall 42. Two ears 48 extend outwardly from a pair of opposite sidewalls 46. A pair of hooks 49 are formed at free ends of the ears 48 respectively, for engaging in the apertures 24 of the legs 22 of the clip 20, thereby retaining the protective cap 40 to the heat sink 10.

Figure 3:
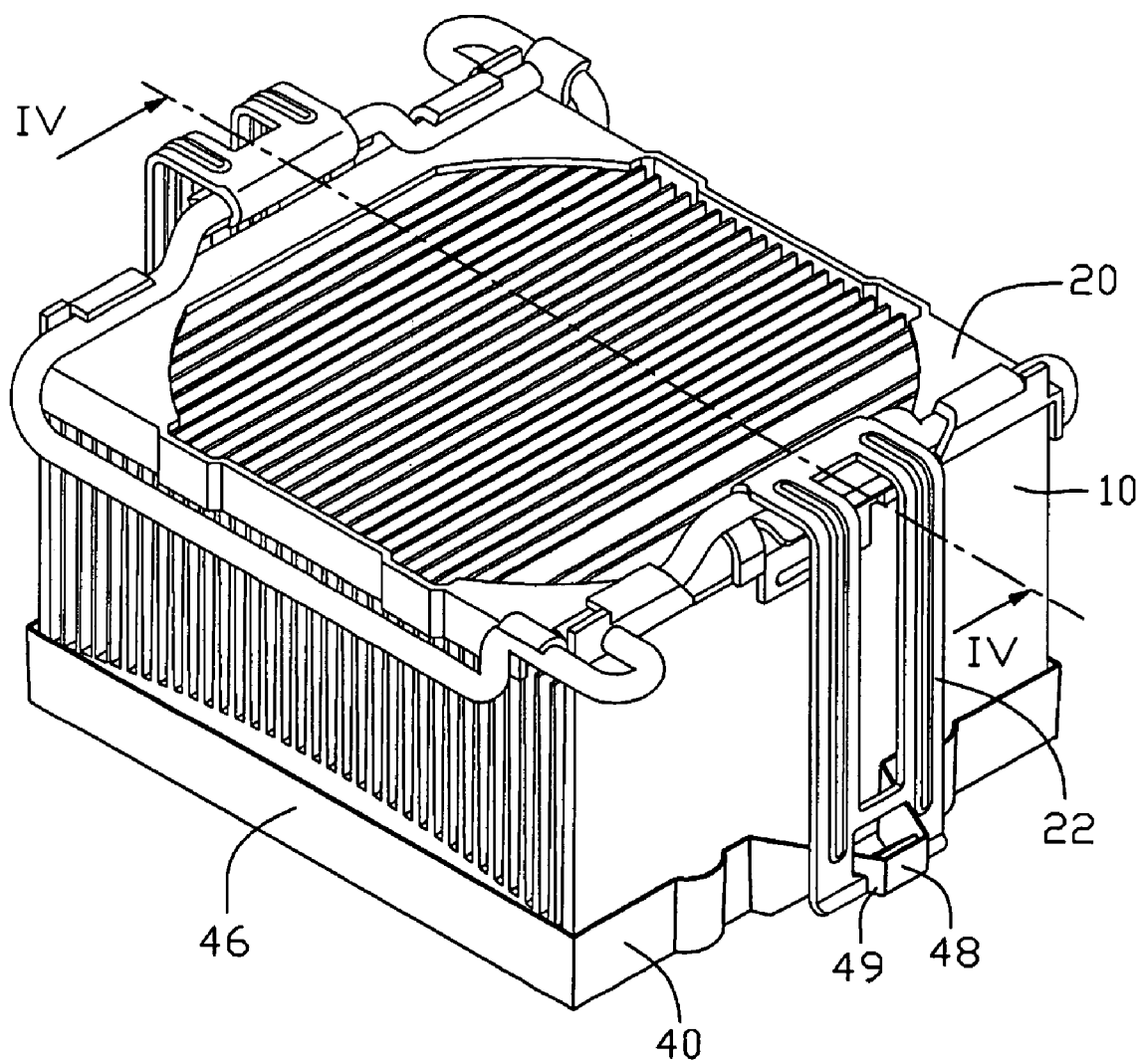
FIG. 3 is an assembled view of the heat dissipation device of FIG. 1.
Figure 4:
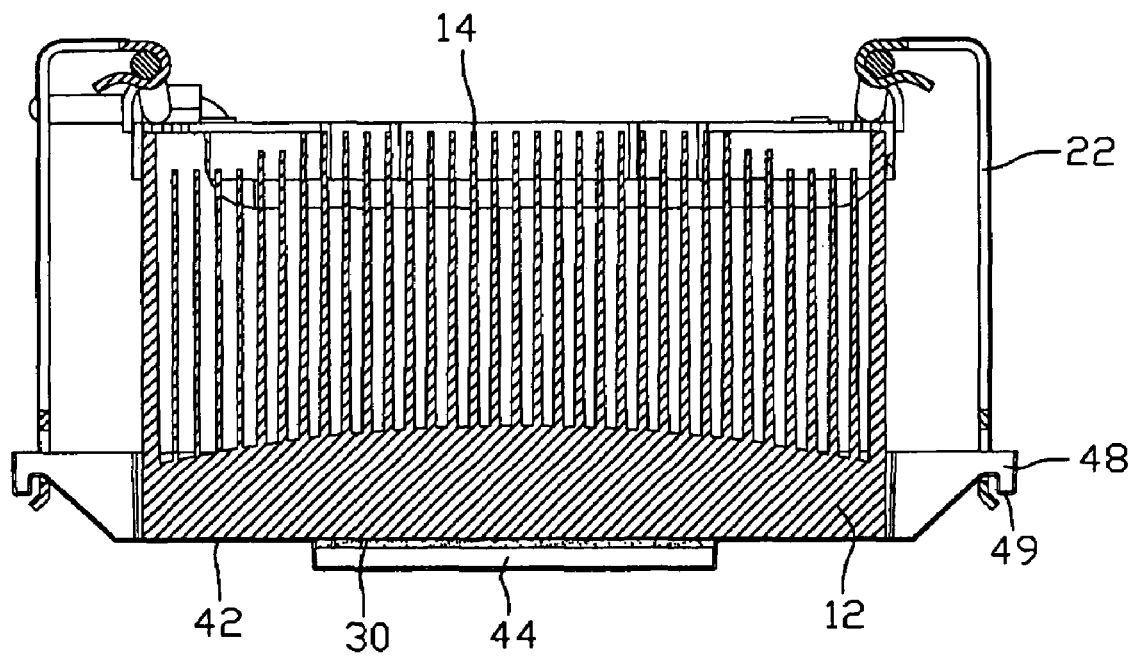
FIG. 4 is a cross sectional view of FIG. 3 taken from line IV—IV.

Referring to FIG. 3 and FIG. 4, when the protective cap 40 is attached to the bottom surface 16 of heat sink 10, the basewall 42 surrounds the thermal interface material 30 and the sidewalls 46 interferentially engage sides of the base 12 of the heat sink 10. The thermal interface material 30 is enclosed in the cavity 44 but spaced apart from an inner surface of the protrusion 44'. Thus the thermal interface material 30 can avoid contamination by dust or foreign particles, and will not contaminate surrounding articles or be destroyed during transportation or handling of the heat sink 10.

Figure 5:
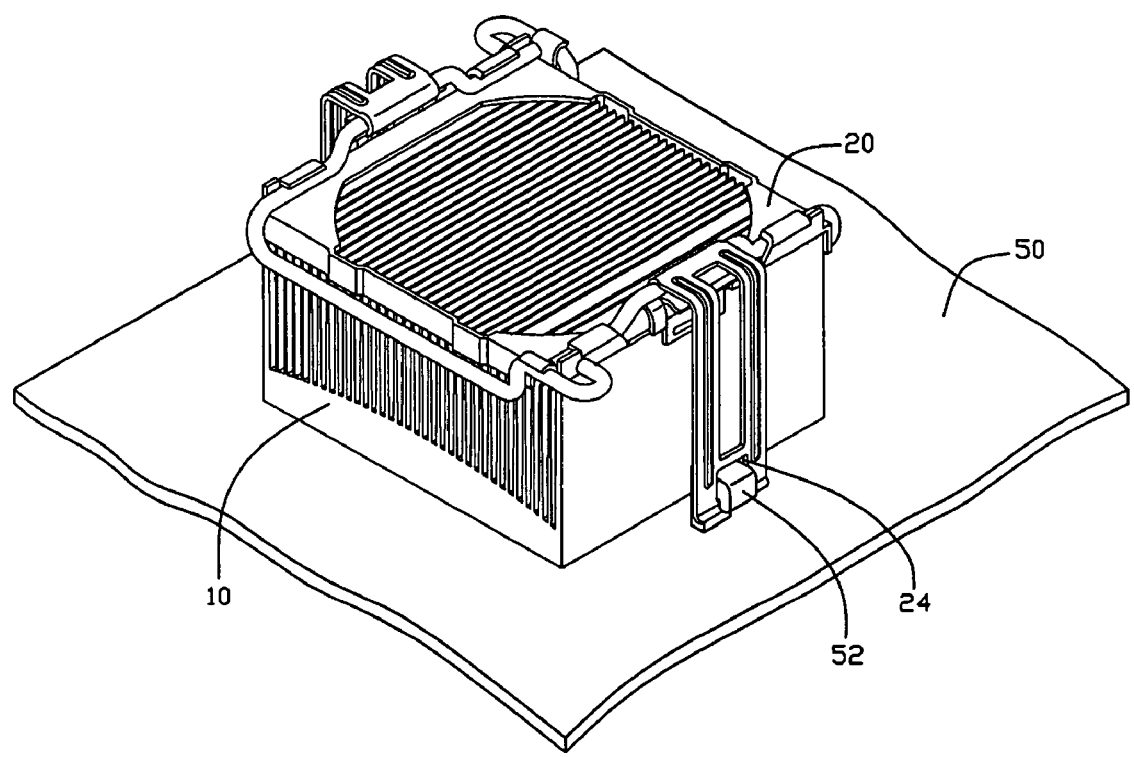
FIG. 5 is an isometric view showing the heat dissipation device mounted to a printed circuit board.

Referring to FIG. 5 and FIG. 6, in assembling the heat sink 10 onto the CPU 54 mounted on a printed circuit board 50, the ears 48 are disengaged from the apertures 24 of the legs 22 of the clip 20, and the protective cap 40 is removed from the heat sink 10 to expose the thermal interface material 30. A pair of engaging members 52 are formed on the printed circuit board 50 at opposite sides of the CPU 54. By engagement of the engaging members 52 in the apertures 24 of the clip 20, the heat sink 10 is mounted on the CPU 54 with the CPU 54 thermally and intimately contacting with the bottom surface 16 of the heat sink 10 through the thermal interface material 30.

By the provision of the protective cap 40, the thermal interface material 30 can be applied to the heat sink 10 in advance. In addition, the protective cap 40 is attached to the heat sink 10 by engaging the ears 48 of the protective cap 40 in the apertures 24 of the legs 22 of the clip 20, and is removed from the heat sink 10 by disengaging the ears 48 of the protective cap 40 from the apertures 24 of the legs 22 of the clip 20. Therefore, the assembly of the heat sink 10 to the CPU 54 is simplified. In comparison with prior art, the present invention does not need to use adhesive in order to attach the protective cap for thermal interface material to the bottom surface of the heat sink; thus, the problem of prior art that the adhesive must be cleaned from the heat sink before the heat sink is attached to the CPU is overcome by the present invention.

In the preferred embodiment of the present invention, the clip forms apertures engagingly receiving the ears of the protective cap, thereby attaching the protective cap to the heat sink. Alternatively, the protective cap may form catch opening, and the clip may form catch means engaging in the catch opening, thereby joining the clip with the protective cap.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A protective cap for thermal interface material spread on a heat sink, the protective cap comprising:
   a basewall defining a cavity for enclosing the thermal interface material therein;
   sidewalls extending from periphery of the basewall; and
   a locking portion comprising a pair of ears extending outwardly from opposite sidewalls, a pair of hooks being formed at free ends of the ears, respectively, the locking portion being adapted for locking with a clip for retaining the protective cap to the heat sink.

2. The protective cap described in claim 1, wherein a protrusion extends outwardly from the central portion of the basewall so as to define the cavity.

3. A heat dissipation device, comprising:
   a heat sink comprising a base;
   thermal interface material spread on a bottom of the base;
   two locking legs disposed at opposite sides of the heat sink; and
   a protective cap enclosing the thermal interface material therein, and comprising locking portions interlocked with the locking legs for retaining the protective cap to the heat sink.

4. The heat dissipation device described in claim 3, wherein the protective cap comprises a basewall defining a cavity to enclose the thermal interface material therein.

5. The heat dissipation device described in claim 4, wherein a protrusion extends outwardly from the central portion of the basewall so as to define the cavity.

6. The heat dissipation device described in claim 4, wherein the protective cap comprises sidewalls extending from periphery of the basewall.

7. The heat dissipation device described in claim 6, wherein the basewall surrounds the thermal interface material and the sidewalls interferentially surround sides of base of the heat sink.

8. The heat dissipation device described in claim 6, wherein said locking portions comprise a pair of ears extending outwardly from opposite sidewalls, a pair of hooks being formed at free ends of the ears, respectively.

9. The heat dissipation device described in claim 8, wherein each locking leg defines an aperture in a free end portion thereof, and the aperture engagingly receives a corresponding hook therein.

10. The heat dissipation device described in claim 3, wherein the locking legs are pivotably attached to the heat sink.

11. The heat dissipation device described in claim 3, wherein the thermal interface material is thermal grease.

12. The heat dissipation device described in claim 3, wherein the thermal interface material is thermal tape.

13. A heat dissipation device comprising:
   a heat sink having a bottom surface and a plurality of fins extending upwardly, top ends of the fins cooperatively forming a top side of the heat sink;
   thermal interface material on the bottom surface of the heat sink;
   a clip attached to the top side of the heat sink for mounting the heat sink to a heat-generating electronic component; and
   a protective cap covering the thermal interface material to prevent contamination thereof, the protection cap having a portion engaging with the clip thereby attaching the protection cap to the heat sink.

14. The heat dissipation device described in claim 13, wherein the clip has a downardly extending leg beside the heat sink, the leg having an aperture in a free end thereof, the portion of the cap engaging with the clip in the aperture.

15. The heat dissipation device described in claim 14, wherein the protective cap has a basewall defining a central cavity receiving the thermal interface material therein, a sidewall extending upwardly from the basewall and engaging with a side of the heat sink.

16. The heat dissipation device described in claim 15, wherein the portion of the protective cap engaging in the aperture of the leg is an ear extending outwardly from the sidewall.

17. The heat dissipation device described in claim 15, wherein the leg is pivotable.

18. The heat dissipation device described in claim 15, wherein the thermal interface material is thermal grease.

* * * * *

UNITED STATES PATENT AND TRADEMARK OFFICE
CERTIFICATE OF CORRECTION

PATENT NO.         : 7,063,136 B2                                              Page 1 of 1
APPLICATION NO.    : 11/135571
DATED              : June 20, 2006
INVENTOR(S)        : Fang-Xiang Yu, Meng-Tzu Lee and Shu-Ho Lin It is certified that error appears in the above-identified patent and that said Letters Patent is hereby corrected as shown below:

On the Title page, item (73) Assignee, should read:

Assignee:    Foxconn Technology Co., Ltd. (TW)

Signed and Sealed this

Twentieth Day of March, 2007

JON W. DUDAS
*Director of the United States Patent and Trademark Office*